United States Patent
Anjo et al.

(10) Patent No.: US 9,389,471 B2
(45) Date of Patent: Jul. 12, 2016

(54) LIQUID CRYSTAL DISPLAY DEVICE

(71) Applicants: JAPAN DISPLAY INC., Tokyo (JP); PANASONIC LIQUID CRYSTAL DISPLAY CO., LTD., Hyogo-Ken (JP)

(72) Inventors: Kenji Anjo, Oamishirasato (JP); Takahiro Nagami, Mobara (JP); Kenichi Hatakeyama, Mobara (JP)

(73) Assignees: Japan Display Inc., Tokyo (JP); Panasonic Liquid Crystal Display Co., LTD., Hyogo-Ken (JP)

( * ) Notice: Subject to any disclaimer, the term of this patent is extended or adjusted under 35 U.S.C. 154(b) by 0 days.

(21) Appl. No.: 14/694,345

(22) Filed: Apr. 23, 2015

(65) Prior Publication Data

US 2015/0227010 A1    Aug. 13, 2015

Related U.S. Application Data

(63) Continuation of application No. 14/491,416, filed on Sep. 19, 2014, now Pat. No. 9,041,893, which is a continuation of application No. 14/145,321, filed on Dec. 31, 2013, now Pat. No. 8,867,011, which is a
(Continued)

(30) Foreign Application Priority Data

Apr. 28, 2008    (JP) ................................ 2008-116981

(51) Int. Cl.
  *G02F 1/1345*    (2006.01)
  *G02F 1/1343*    (2006.01)
(Continued)

(52) U.S. Cl.
  CPC ........ *G02F 1/134336* (2013.01); *G02F 1/1339* (2013.01); *G02F 1/1345* (2013.01);
(Continued)

(58) Field of Classification Search
  USPC ......................................................... 349/152
  See application file for complete search history.

(56) References Cited

U.S. PATENT DOCUMENTS 7,561,239 B2 *  7/2009  Fujita ................ G02F 1/133707
                                                              349/142
2006/0139551 A1    6/2006  Kimura
(Continued)

FOREIGN PATENT DOCUMENTS

JP          64-077024 A       3/1989
JP          10-031224 A       2/1998
(Continued)

OTHER PUBLICATIONS

Office Action dated on Aug. 19, 2014 regarding a counterpart Japanese patent application No. 2013-215962.

*Primary Examiner* — Eric Wong

(74) *Attorney, Agent, or Firm* — Typha IP LLC

(57) ABSTRACT

A liquid crystal display device includes a TFT substrate having a display region with first and second electrodes, TFTs, scanning signal lines connected to the TFTs, a counter substrate, a liquid crystal layer sandwiched between the TFT substrate and counter substrates, and sealed by a sealant, scanning line leads connected to the scanning signal lines and formed outside of the display region, video signal line leads connected to the video signal lines and formed outside of the display region and a shield electrode formed on the TFT substrate covering the scanning line leads but not the video signal line leads. The second electrode is connected to a TFT, and liquid crystal molecules of the liquid crystal layer are driven by an electric field, which is generated between the first and second electrodes. The shield electrode is electrically connected to the first electrode and overlapped with the sealant in plan view.

1 Claim, 7 Drawing Sheets

Related U.S. Application Data continuation of application No. 13/569,484, filed on Aug. 8, 2012, now Pat. No. 8,634,049, which is a continuation of application No. 12/430,973, filed on Apr. 28, 2009, now Pat. No. 8,248,568.

(51) Int. Cl.
*G02F 1/1362* (2006.01)
*G02F 1/133* (2006.01)
*G02F 1/1333* (2006.01)
*G02F 1/1335* (2006.01)
*G02F 1/1339* (2006.01)
*G02F 1/1368* (2006.01)

(52) U.S. Cl.
CPC .......... *G02F1/1368* (2013.01); *G02F 1/13306* (2013.01); *G02F 1/13439* (2013.01); *G02F 1/133345* (2013.01); *G02F 1/133512* (2013.01); *G02F 1/134363* (2013.01); *G02F 1/136209* (2013.01); *G02F 1/136286* (2013.01); *G02F 2001/13456* (2013.01); *G02F 2001/134372* (2013.01); *G02F 2001/136218* (2013.01)

(56) References Cited

U.S. PATENT DOCUMENTS

| 2007/0296674 A1 | 12/2007 | Aoki et al. |
| 2008/0165315 A1 | 7/2008 | Nishida et al. |

FOREIGN PATENT DOCUMENTS

| JP | 2002-040442 A | 2/2002 |
| JP | 2005-084150 A | 3/2005 |
| JP | 2005-275054 A | 10/2005 |
| JP | 2006-209089 A | 8/2006 |
| JP | 2007-248903 A | 9/2007 |
| JP | 2008-003118 A | 1/2008 |
| JP | 2008-026869 A | 2/2008 |
| JP | 2008-058573 A | 3/2008 |

\* cited by examiner

LIQUID CRYSTAL DISPLAY DEVICE

CROSS REFERENCE TO RELATED APPLICATION

This application is a continuation of U.S. application Ser. No. 14/491,416, filed on Sep. 19, 2014 (now U.S. Pat. No. 9,041,893), which is a continuation of U.S. application Ser. No. 14/145,321, filed on Dec. 31, 2013 (now U.S. Pat. No. 8,867,011), which, in turn, is a continuation of U.S. application Ser. No. 13/569,484, filed on Aug. 8, 2012 (now U.S. Pat. No. 8,634,049), which, in turn, is a continuation of U.S. application Ser. No. 12/430,973, filed on Apr. 28, 2009 (now U.S. Pat. No. 8,248,568), the entire contents of which are incorporated herein by reference.

CLAIM OF PRIORITY

The present application claims priority from Japanese Patent Application JP 2008-116981 filed on Apr. 28, 2008, the content of which is hereby incorporated by reference into this application.

BACKGROUND OF THE INVENTION

1. Field of the Invention

The present invention concerns a display device and, particularly, it relates to a liquid crystal display device of an in-plane electric field system (IPS) excellent in view angle characteristics with no image unevenness also at the periphery of a display region.

2. Description of Related Art

In a liquid crystal display device, a TFT substrate having pixel electrodes and thin film transistors (TFT) formed in a matrix and a counter substrate opposed to the TFT substrate and having color filters, etc, formed at portions corresponding to the pixel electrode of the TFT substrate are disposed, and liquid crystals are put between the TFT substrate and the counter substrate. Then, images are formed by controlling the transmittance of a light by liquid crystal molecules on every pixel.

Since the liquid crystal display device is flat and light in weight, application use thereof has been extended in various fields. Small-sized liquid crystal display devices are generally used for cellular phones, DSC (Digital Still Cameras), etc. In the cellular phones and DSC, there exists a demand of enlarging the size of the display screen while keeping the outer shape of a liquid crystal display device small. Then, a so-called frame at the periphery of the display region is reduced. In such a constitution, the periphery of the display region tends to undergo the effect of potential fluctuation at, etc. at the frame portion.

On the other hand, view angle characteristics become a problem in the liquid crystal display devices. The view angle characteristics concern a phenomenon that the luminance or chromaticity changes between a case of observing a screen at the front and a case of observing the screen obliquely. For the view angle characteristics, an IPS (in plane switching system) of operating liquid crystal molecules by an electric field in a horizontal direction has excellent characteristics.

Japanese Unexamined Patent Publication No. 2005-275054 describes a liquid crystal display device of the IPS system in which a tapered portion of scanning line leads is covered with a conductive film by way of an insulative film so that blanking does not occur at the periphery of a display region by noises from the scanning line leads. That is, a pitch in the terminal portion for connecting the scanning lines with external circuits is smaller than the pitch of the scanning lines formed in the display region. Then, the scanning line leads that connect the terminal portion with the scanning lines of the display region are in the form of oblique (tapered) wirings for adjusting the pitch between the display region and the terminal portion. In the oblique wiring portion, since the wiring density is higher than that in the display region and noises due to scanning signals tend to be generated, it is intended to cover the portion with the conductive film thereby reducing the effect of the noises from the tapered portion in JP-A No. 2005-275054. For the conductive film, ITO (indium tin oxide) which is identical with that used for the pixel electrode is used.

In the constitution descried in JP-A No. 2005-275054, the scanning line lead is covered with ITO which is identical with that used for the pixel electrode. In a case of covering the scanning line lead with ITO, close adhesion between ITO and a sealant causes a problem. An epoxy resin is generally used for the sealant. The sealant has good adhesion with an insulative film such as made of SiN and can maintain a favorable sealing property. However, in a case where the sealant is in direct contact with the conductive film such as an ITO film, reliability of sealing is not always known.

As in the constitution described in JP-A No. 2005-275054, when the scanning line lead is covered with ITO that is formed at the same time with the pixel electrode, this causes a problem for the reliability depending on the relation between ITO and the sealant. Further, while the extent of covering the region of the peripheral ITO gives a significant effect on the shielding effect to the scanning line leads, JP-A No. 2005-275054 has no descriptions for such a problem.

Further, in the constitution of JP-A No. 2005-275054, since ITO used for shielding the scanning line lead is identical with that used for the pixel electrode, it can not be formed continuously from the display region, to result in a portion where the scanning line lead is not covered with ITO at the boundary between the scanning line and the scanning line lead portion. Then, the effect of scanning signals is generated from the portion not covered with ITO.

The present invention intends to eliminate blanking due to the effect of scanning in the display region in a liquid crystal display device of the IPS system, while maintaining the sealing reliability by a sealant.

SUMMARY OF THE INVENTION

The present invention intends to overcome the problems described above in accordance with the specific constitutions described above.

(1) A liquid crystal display device in which a liquid crystal layer is put between a TFT substrate having a first electrode formed in a planar shape, a second electrode disposed above the first electrode by way of an insulative film, and a display region where pixels each formed with a TFT are arranged in a matrix, and a counter substrate opposed to the TFT substrate and formed with a color filter, and the liquid crystal layer is sealed by a sealant formed at the periphery of the TFT substrate and the counter substrate, wherein scanning lines are extended in a first direction and arranged in a second direction, and video signal lines are extended in the second direction and arranged in the first direction in the display region, scanning line leads that connect the scanning lines with a scanning line driving circuit are formed to the outside of the display region, a shield electrode formed coplanar with the first electrode is extended as far as a portion below the sealant while covering the scanning line leads, and the insulative film is present between the shield electrode and the sealant, and a potential identical with a potential of the first electrode is applied to the shield electrode.

(2) The liquid crystal display device according to (1) described above, wherein the second electrode is an interdigitated electrode.

(3) The liquid crystal display device according to (1) described above, wherein a portion overlapped with the sealant and a portion not overlapped therewith in a planar view are present in the shield electrode, and a width L1 for the overlapped portion and a width L2 for the non-overlapped portion are defined as: L2>L1.

(4) The liquid crystal display device according to (1) described above, wherein video signal line leads that connect the video signal lines with a video signal driving circuit are formed to the outside of the display region, and the shield electrode does not cover the video signal line leads.

(5) The liquid crystal display device according to (1) described above, wherein the first electrode and the shield electrode are formed as a continuous film.

(6) A liquid crystal display device in which a liquid crystal layer is put between a TFT substrate having a first electrode formed in a planar shape, a second electrode disposed above the first electrode by way of an insulative film, and a display region where pixels each formed with a TFT are arranged in a matrix, and a counter substrate opposed to the TFT substrate and formed with a color filter, and the liquid crystal layer is sealed by a sealant formed at the periphery of the TFT substrate and the counter substrate, wherein scanning lines are extended in a first direction and arranged in a second direction, and video signal lines are extended in the second direction and arranged in the first direction in the display region of the TFT, scanning line leads that connect the scanning lines with a scanning line driving circuit are formed to the outside of the display region, a shield electrode formed coplanar with the first electrode is extended as far as a portion below the sealant while covering the scanning line leads, and the insulative film is present between the shield electrode and the sealant, and a potential identical with a potential of the second electrode is applied to the shield electrode.

(7) The liquid crystal display device according to (6) described above, wherein the second electrode is an interdigitated electrode.

(8) The liquid crystal display device according to (6) described above, wherein a portion overlapped with the sealant and another portion not overlapped therewith in a planar view are present in the shield electrode, and a width L1 for the overlapped portion and a width L2 for the non-overlapped portion are defined as: L2>L1.

(9) A liquid crystal display device in which a liquid crystal layer is put between a TFT substrate having a first electrode formed in a planar shape, a second electrode disposed above the first electrode by way of an insulative film, and a display region where pixels each formed with a TFT are arranged in a matrix, and a counter substrate opposed to the TFT substrate and formed with a color filter, and the liquid crystal layer is sealed by a sealant formed at the periphery of the TFT substrate and the counter substrate, wherein scanning lines are extended in a first direction and arranged in a second direction, and video signal lines are extended in the second direction and arranged in the first direction in the display region of the TFT, a scanning line driving circuit is disposed to the outside of the sealant in the second direction, and scanning line leads for connecting the scanning lines with the scanning line driving circuit are extended in the second direction to the outside of the display region, a shield electrode formed coplanar with the first electrode is extended as far as a portion below the sealant while covering the scanning line leads, and the insulative film is present between the shield electrode and the sealant, and a potential identical with a potential of the first electrode is applied to the shield electrode.

(10) The liquid crystal display device according to (9) described above, wherein the scanning line leads extending in the second direction are formed below the sealant, and an insulative film is present between the sealant and the scanning line leads.

(11) The liquid crystal display device according to (9) described above, wherein the scanning line leads include first scanning line leads and second scanning line leads formed in a layer different from the first scanning line lead by way of an insulative film, and an insulative film is present between the first scanning line leads and the second scanning line leads, and the sealant.

(12) A liquid crystal display device in which a liquid crystal layer is put between a TFT substrate having a first electrode formed in a planar shape, a second electrode disposed above the first electrode by way of an insulative film, and a display region where pixels each formed with a TFT are arranged in a matrix, and a counter substrate opposed to the TFT substrate and formed with a color filter, and the liquid crystal layer is sealed by a sealant formed at the periphery of the TFT substrate and the counter substrate, wherein scanning lines are extended in a first direction and arranged in a second direction, and video signal lines are extended in the second direction and arranged in the first direction in the display region, a scanning line driving circuit is disposed to the outside of the sealant in the second direction, and scanning line leads for connecting the scanning lines with the scanning line driving circuit are extended in the second direction to the outside of the display region, a shield electrode formed coplanar with the first electrode is extended as far as a portion below the sealant while covering the scanning line leads, and the insulative film is present between the shield electrode and the sealant, and a potential identical with a potential of the second electrode is applied to the shield electrode.

(13) The liquid crystal display device according to (12) described above, wherein the scanning line leads extending in the second direction are formed below the sealant, and an insulative film is present between the sealant and the scanning line leads.

(14) The liquid crystal display device according to (12) described above, wherein the scanning line leads include first scanning line leads and second scanning line leads formed in a layer different from the first scanning leads by way of an insulative film, and an insulative film is present between the first scanning line leads and the second scanning line leads, and the sealant.

According to the invention, since the scanning line leads for supplying a gate voltage to the scanning lines are covered with the shield electrode applied with a common voltage, charging to the common electrode by the gate voltage can be prevented, and a blanking phenomenon generated at the periphery of the display region due to the charging by the counter substrate can be prevented.

Further, in the invention, since the shield electrode is extended as far as the portion below the sealant, effect of the gate electrode applied to the scanning line leads can be prevented more reliably. Further, in the invention, since the insulative film is disposed between the shield electrode and the sealant, deterioration of the sealing effect for the sealant can be prevented.

DETAILED DESCRIPTION OF THE ACCOMPANYING DRAWINGS

PREFERRED EMBODIMENTS OF THE INVENTION

The present invention is to be described specifically by way of the following preferred embodiments.

Embodiment 1

Figure 1:
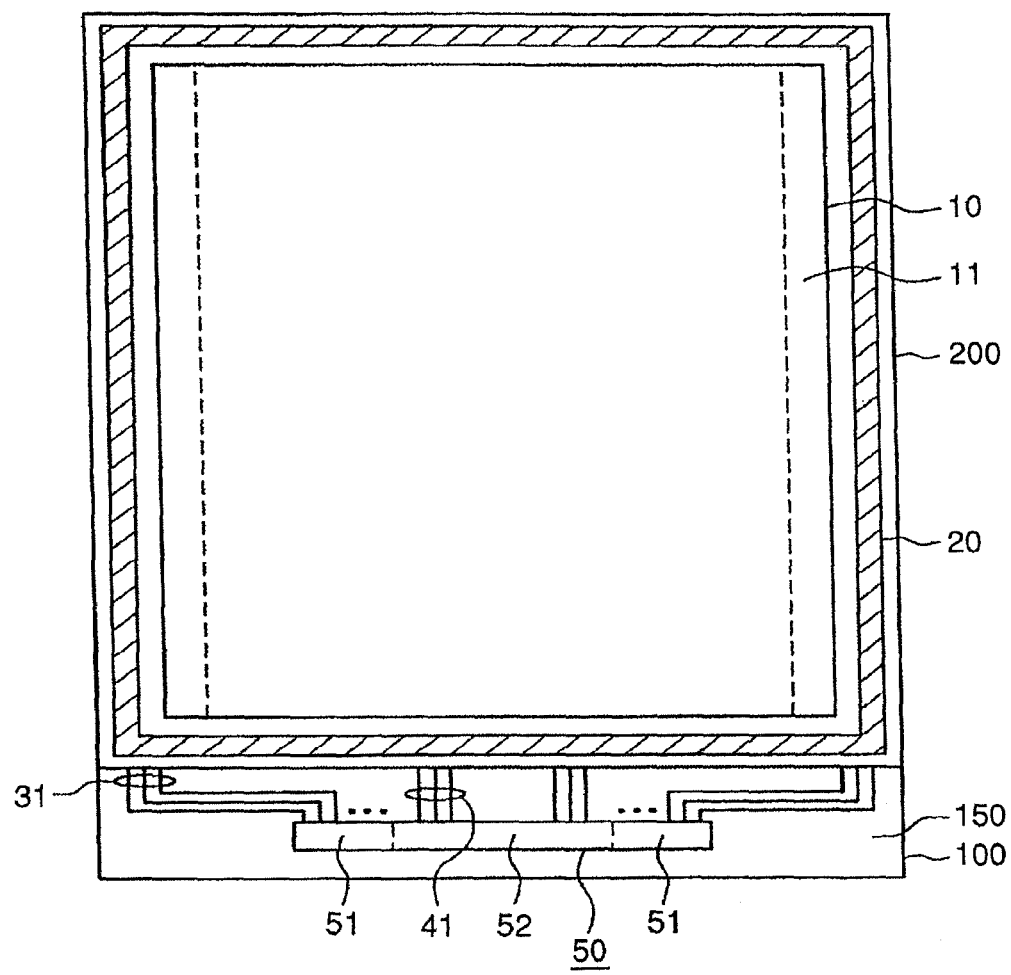
FIG. 1 is a plan view of a liquid crystal display device according to the present invention.

FIG. 1 is a plan view of a liquid crystal display device applied with the present invention which is used, for example, in cellular phones. In FIG. 1, a counter substrate 200 is disposed above a TFT substrate 100. A liquid crystal layer is put between the TFT substrate 100 and the counter substrate 200. The TFT substrate 100 and the counter substrate 200 are bonded by a sealant 20 formed to a frame portion. The TFT substrate 100 is made larger than the counter substrate 200, in which a terminal portion 150 for supplying a power source, video signals, scanning signals, etc. to the TFT substrate 100 is formed to a portion of the TFT substrate which is made larger than the counter substrate 200.

Further, an IC driver 50 for driving scanning lines, video signal lines, etc. are disposed to the terminal portion 150. The IC driver 50 is divided into three regions in which a video signal driving circuit 52 is disposed at a central portion and scanning signal driving circuits 51 are disposed on both sides of them.

In the display region 10 shown in FIG. 1, unillustrated scanning lines are extended in the lateral direction and arranged in the vertical direction. Further, unillustrated video signal lines are extended in the vertical direction and arranged in the lateral direction. The scanning lines are connected by way of the scanning line leads 31 to the scanning signal driving circuits 51 of the IC driver 50. In FIG. 1, since the display region 10 is arranged at the central portion of the liquid crystal display device, the scanning line leads 31 are disposed on both sides of the display region 10 and, accordingly, the scanning line driving circuits 51 are disposed on both sides of the IC driver 50. On the other hand, video signal line leads 41 that connect the video signal lines with the IC driver 50 are gathered on the lower side of the screen. The video signal line leads 41 are connected with the video signal driving circuit 52 disposed at the central portion of the IC driver 50.

Since the scanning signals supply a gate voltage for turning TFT on or off, this voltage is high. Accordingly, the scanning signals more tend to cause noises in the inside of the liquid crystal display device compared with video signals, etc. Particularly, the periphery of the screen where the scanning line leads 31 are present is liable to undergo the effect of the scanning signals as will be described later. As a result, blanking 11 occurs in a region as shown by dotted lines in FIG. 1. The portion for the blanking 11 is in a state where the contrast is deteriorated.

Figure 2:
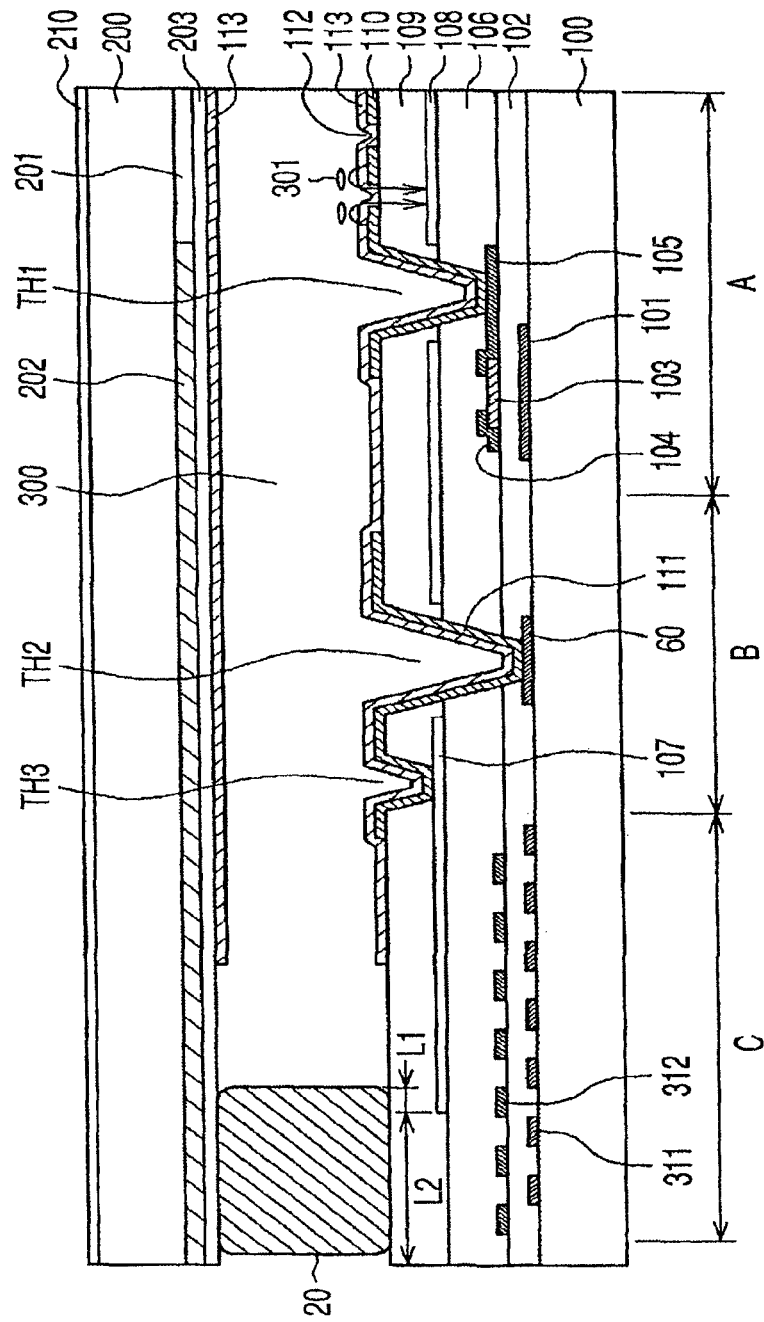
FIG. 2 is a cross sectional view of the liquid crystal display device of the invention.
Figure 4:
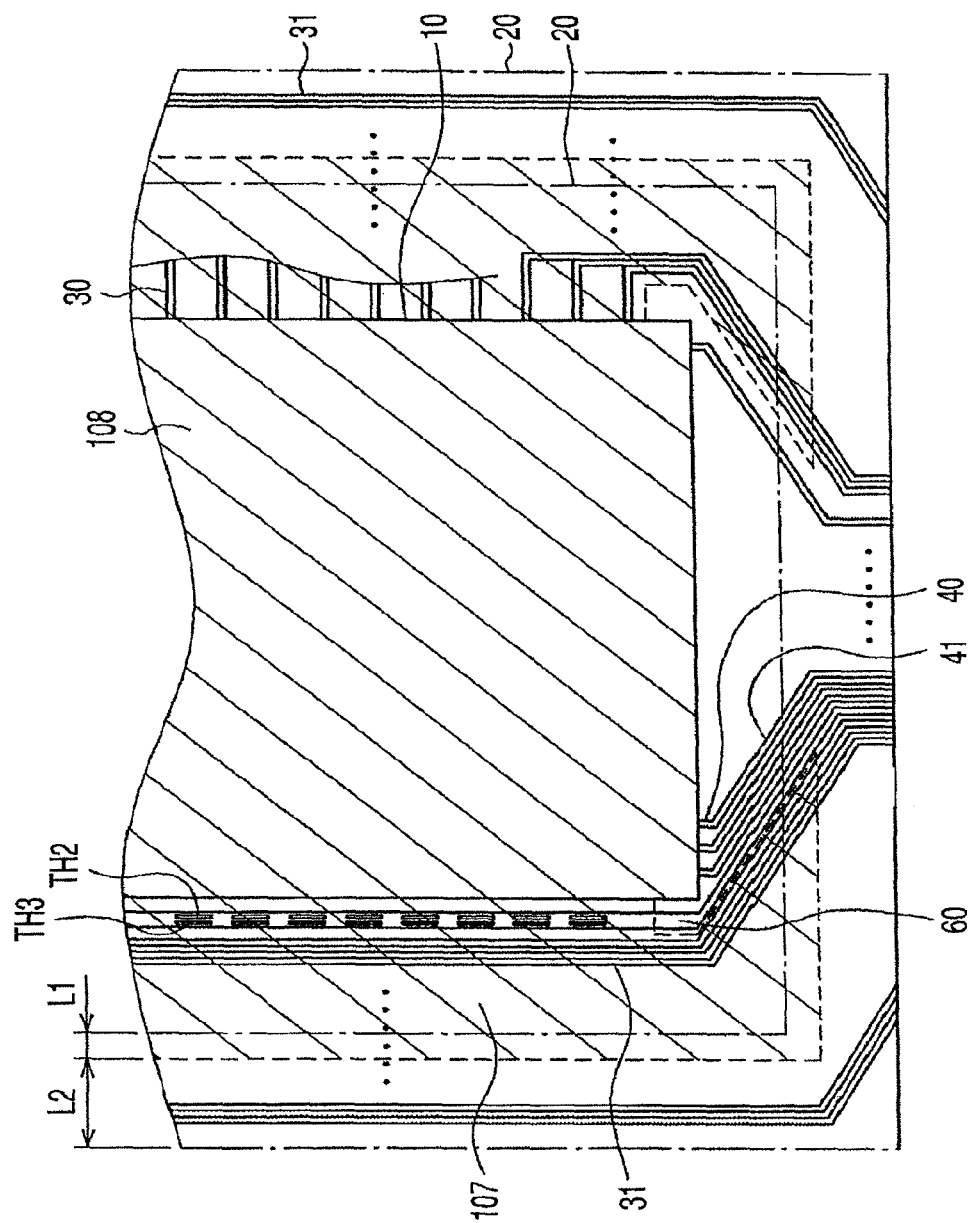
FIG. 4 is a plan view of a TFT substrate of the liquid crystal display device of the invention.

FIG. 2 is a cross sectional view showing the constitution of the invention which is adapted so as not to cause such blanking. The liquid crystal display device shown in FIG. 2 is a liquid crystal display device of an IPS system. FIG. 4 is a plan view of a TFT substrate in the identical liquid crystal display device. The liquid crystal device in FIG. 2 includes a section divided from the right side thereof into a pixel area A that constitutes a portion of a display region 10, a common wiring connection area B that connects a common wiring 60 with a shield electrode 107 or a common electrode 108, and a scanning line lead area C. As shown in FIG. 4, since the common electrode 108 and the shield electrode 107 are formed as a continuous film, when a common voltage is supplied to the shield electrode 107, the common voltage is also supplied simultaneously to the common electrode 108.

At first, the constitution of the pixel area in FIG. 2 is to be described. In FIG. 2, a gate electrode 101 is formed above a TFT substrate 100 formed of glass. The gate electrode 101 is formed coplanar with the scanning lines 30. The gate electrode 101 includes an Al alloy and an Mo alloy stacked thereon.

A gate insulator 102 is formed of SiN while covering the gate electrode 101. A semiconductor layer 103 is formed of an a-Si film above the gate insulator 102 at a position opposing to the gate electrode 101. The a-Si film is formed by plasma CVD. The a-Si film forms a channel portion of the TFT, and a source electrode 104 and a drain electrode 105 are formed above the a-Si film while putting the channel portion therebetween. An unillustrated n$^+$Si layer is formed between the a-Si film and the source electrode 104 or the drain electrode 105 for establishing an ohmic contact between the semiconductor layer 103 and the source electrode 104 or the drain electrode 105.

The source electrode 104 is used also as video signal lines 40, and the drain electrode 105 is connected with a pixel electrode 110. The source electrode 104 and the drain electrode 105 are formed as a coplanar layer simultaneously. In this embodiment, the source electrode 104 and the drain electrode 105 are formed of an Mo alloy. When it is intended to lower the electric resistance of the source electrode 104 or the drain electrode 105, an electrode structure, for example, including an Al alloy sandwiched between Mo alloys is used.

An inorganic passivation film 106 is formed of SiN and disposed while covering the TFT. The inorganic passivation film 106 protects TFT, particularly, the channel portion thereof against impurities. While an organic passivation film may be formed above the inorganic passivation film 106, only the inorganic passivation film 106 is used in this embodiment.

A common electrode 108 is formed above the inorganic passivation film 106. The common electrode 108 is formed by sputtering ITO (indium tin oxide) as a transparent conductive film over the entire display region 10. That is, the common electrode 108 is formed in a planar shape. After forming the common electrode 108 by sputtering over the entire surface, only the through hole portion for conducting the pixel electrode 110 and the drain electrode 105 is removed by etching the common electrode 108. In this case, the shield electrode 107 to be described later is formed simultaneously.

An upper insulative film 109 is formed of SiN and disposed while covering the common electrode 108. After forming the upper insulative film 109, through holes are formed by etching. A first through hole TH1 is formed by etching the inorganic passivation film 106 using the upper insulative film 109 as a resist. Then, ITO is formed as the pixel electrode 110 by sputtering while covering the upper insulative film 109 and the first through hole TH1. The pixel electrode 110 is formed by patterning the sputtered ITO. ITO as the pixel electrode 110 is deposited also to the first through hole TH1, the second through hole TH2, and the third through hole TH3 simultaneously and patterned simultaneously to form a connection electrode 111 in the second through hole TH2 and the second through hole TH3. In the first through hole TH1, the drain electrode 105 extended from the TFT and the pixel electrode 110 conduct with each other, and video signals are supplied to the pixel electrode 110.

Figure 3:
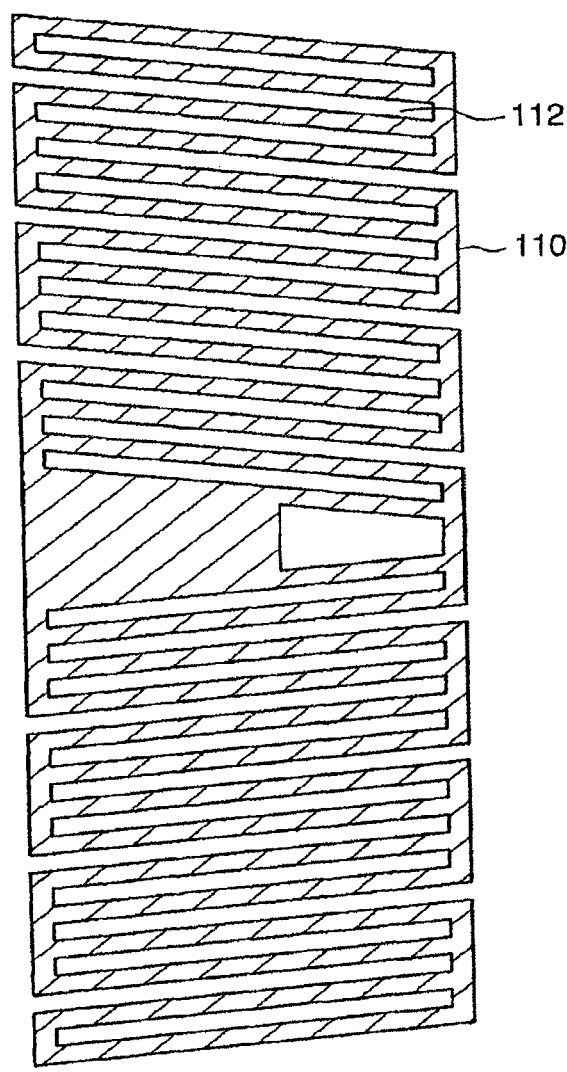
FIG. 3 is a plan view of the pixel electrode shown in FIG. 2.

FIG. 3 shows an example of the pixel electrode 110. The pixel electrode 110 is an interdigitated electrode closed at both ends. A slit 112 is formed between digits. Below the pixel electrode 110, an unillustrated planar common electrode 108 is formed. When the video signals are applied to the pixel electrode 110, liquid crystal molecules 301 are rotated by lines of electric force generated between the common electrode 108 and the pixel electrode 110 through the slit 112. This controls a light that passes through the liquid crystal layer 300 to form images.

The pixel area in FIG. 2 explains the state in the cross sectional view. The slit 112 is defined between adjacent interdigitated electrodes. A common voltage is applied to the common electrode 108 and a voltage by the video signal is applied to the pixel electrode 110. When the voltage is applied to the pixel electrode 110, as shown in FIG. 2, lines of electric force are generated to rotate the liquid crystal molecules 301 in the direction of the lines of electric force to thereby control the transmittance of a light from a back light. Since the light transmittance from the back light is controlled on every pixels, images are formed. An alignment film 113 is formed above the pixel electrode 110 for aligning the liquid crystal molecules 301.

In FIG. 2, a counter substrate 200 is disposed while sandwiching a liquid crystal layer 300 relative to the TFT substrate. A color filter 201 is formed at the inside of the counter substrate 200. As the color filter 201, red, green, and blue color filters 201 are formed on every pixels to form color images. A black matrix 202 is formed between a color filter 201 and another color filter 201 adjacent thereto to improve the contrast of images. However, since FIG. 2 is a cross sectional view for the periphery of the display region 10, the color filter 201 is shown only for one color and a most portion is covered with the black matrix 202 as a light shielding film.

An over coat film 203 is formed while covering the color filter 201 and the black matrix 202. Since the surface of the color filter 201 and the black matrix 202 is uneven, the surface is planarized by the overcoat film 203. An alignment film 113 for aligning the liquid crystal molecules 301 is formed on the overcoat film 203. Since FIG. 2 shows the IPS, the common electrode 108 is formed on the side of the TFT substrate 100 and not formed on the side of the common electrode 200.

As shown in FIG. 2, a conductive film is not formed to the inside of the counter substrate 200 in the IPS system. Then, the potential of the counter substrate 200 becomes instable. Further, electromagnetic noises from the outside intrude into the liquid crystal layer 300 to give undesired effects on the images. In order to eliminate such a problem, a surface conductive film 210 is formed to the outside of the counter substrate 200. The surface conductive film 210 is formed by sputtering ITO as a transparent conductive film.

As described above, while electromagnetic noises, etc. from the outside of the liquid crystal display device can be shielded by the surface conductive film 210, charges in the inside of the liquid crystal display device by the effect of the gate voltage or the like that are generated in the inside of the liquid crystal display device can not be coped with by the surface conductive film 210. Such a problem is coped with by the constitution of the invention to be described later.

A common voltage is applied to the common electrode 108 from the common wiring 60. The common wiring 60 is formed coplanar with the scanning lines 30 or the gate electrode 101. In FIG. 2, the common electrode 108 and the shield electrode 107 covering the scanning line leads 31 are formed as a continuous film as shown in FIG. 4. Accordingly, as shown in FIG. 2, when the common wiring 60 and the shield electrode 107 are connected, the common wiring 60 and the common electrode 108 are connected at the same time.

The common wiring 60 and the shield electrode 107 are connected as described below. A through hole is formed in the upper insulative film 109, the inorganic passivation film 106, and the gate insulator 102 to expose a portion of the common wiring 60. On the other hand, a through hole is formed in the upper insulative film 109 to expose a portion of the shield electrode 107. Then, when an ITO film for forming the pixel electrode 110 is sputtered, ITO is deposited at the same time and the ITO film is patterned simultaneously with the pixel electrode 110 to thereby form a connection electrode 111 and connect the shield electrode 107 with the common electrode 108.

In FIG. 2, the scanning line lead area C is a portion showing the characteristic feature of the invention. The scanning line leads 31 in FIG. 2 have a two-layered structure. Particularly, in a small sized liquid crystal display device, it is strongly demanded to narrow the frame portion at the periphery of the display region 10. The scanning line leads 31 are disposed in the frame portion at the outside of the display region 10. In a case where the scanning line leads 31 are disposed in a coplanar layer, it is necessary to take a distance between each of the scanning line leads 31 and this imposes a limit on the narrowing of the frame portion.

In the scanning line lead area C in FIG. 2, the space occupied by the scanning line leads 31 is decreased by disposing the scanning line leads 31 separately into two layers, that is, first scanning line leads 311 and second scanning line leads 312. In FIG. 2, the first scanning line leads 311 are formed coplanar with the scanning lines 30 or the gate electrode 101, and the second scanning line leads 312 are formed coplanar with the video signal lines 40 or the drain electrode 105. The scanning lines 30 and the second scanning line leads 312 are connected by a through hole not illustrated in FIG. 2.

Since the gate insulator 102 is present between the first scanning line leads 311 and the second scanning line leads 312, the first scanning line leads 311 and the second scanning line leads 312 can be arranged with no gaps therebetween or in superposition to each other in a planar view. Accordingly, the frame region can be narrowed.

A gate voltage at a relatively high voltage for turning the TFT on and off is applied to the scanning lines 30 and the scanning line leads 31. Particularly, when the scanning line leads 31 are not covered with the shield electrode 107 or the like, a portion of the common electrode 108 is charged by the effect of the gate voltage. Particularly, when the black matrix 202 formed to the counter substrate 200 is formed of a resin or the like as an insulator, the black matrix 202 is liable to be charged. When the counter substrate 200 is charged, the effect prevails as far as the liquid crystal layer 300 and noises are formed in the video signals to generate the blanking at the periphery of the screen.

In the invention, the effect of the gate voltage on the counter substrate 200 is prevented by extending the shield electrode 107 formed simultaneously with the common electrode 108 as far as a portion below the sealant 20 and completely covering the scanning line leads 31. The shield electrode 107 is formed of an ITO film which is identical with that used for the common electrode 108. Further, an inorganic passivation film 106 formed of SiN is present between the second scanning line leads 312 and the shield electrode 107.

The shield electrode 107 is covered with the upper insulative film 109. Accordingly, the sealant 20 and ITO constituting the shield electrode 107 are not in direct contact with each other. Accordingly, the sealant 20 is in contact with the upper insulative film 109 as an insulator to enhance the reliability for the seal portion.

The shield electrode 107 is extended to the portion below the sealant 20 thereby improving the shielding effect for the scanning line leads 31. However, the shield line is not extended beyond the sealant 20 as far as the outside. This is for preventing that the bonding strength at the boundary between the ITO film constituting the shield electrode 107 and the upper insulative film 109 or the inorganic passivation film 106 gives undesired effects on the sealing reliability.

Accordingly, for the shield electrode 107, a region L1 overlapped with the sealant 20 and a region L2 not overlapped with the sealant 20 are present below the sealant 20 as shown in FIG. 2. For maintaining a high reliability of the sealing portion, it is desirable to define the regions as: L2>L1.

FIG. 4 is a plan view of the TFT substrate 100 of the liquid crystal display device according to the invention. In FIG. 4, the TFT substrate 100 is disposed as far as the sealant 20. The sealant 20 is shown by a dotted chain. In FIG. 4, the scanning lines 30 are extended in the lateral direction and arranged in the vertical direction in the display region 10. Further, the video signal lines 40 are extended in the vertical direction and arranged in the lateral direction. The scanning lines 30 are connected with the scanning line leads 31 present on both sides of the display region 10. Further, the video signal lines 40 are connected with the video signal lines leads 41 that are present below the display region 10.

The scanning line leads 31 present on both sides of the display region 10 are extended to a portion lower than the display region 10 and connected with the scanning line driving circuits 51 of the IC driver 50. The video signal is line leads 41 present at a lower side of the display region 10 are connected with the video signal driving circuit 52 which is present to a further lower side of the display region 10. In FIG. 4, the scanning lines 31 are present with no gaps to each other in a planar view. As has been described above with reference FIG. 2 such an arrangement is possible, since the scanning lines 31 have a two-layered structure and they are insulated from each other by the insulation film.

In FIG. 4, the common wiring 60 is extended on the right of the display region 10, and the common wiring 60 is connected by way of the second through hole TH2 and the third through hole TH3 to the shield electrode 107 and the common electrode 108 formed as a film in contiguous with the shield electrode 107. The display region 10 is entirely covered with the common electrode 108 and the scanning line leads 31 present on both sides of the display region 10 are covered with the shield electrode 107. The common electrode 108 and the shield electrode 107 are formed of a continuous film and this is shown by hatched lines. Accordingly, at the inside of the sealant 20, the scanning lines 30 and the scanning line leads 31 are entirely covered with the common electrode 108 or the shield electrode 107 formed of ITO. While the shield electrode 107 covers the scanning line leads 31, it does not cover the video signal line leads 41. This is because the video signal voltage is low and the signal is unlikely to charge the counter substrate 200. When the shield electrode 107 covers the video signal line leads 41, the capacitance between the video signal line leads 41 is increased to possibly give undesired effects on the processing speed of the video signals depending on the case.

The shield electrode 107 is overlapped with the sealant 20 in a planar view. The amount of overlap between the sealant 20 and the shield electrode 107 is L1, while the amount of non-overlap between them is L2. As has been described with reference to FIG. 2, the amounts are defined as: L2>L1 in this embodiment. Further, the upper insulative film 109 formed of SiN is present between the shield electrode 107 and the sealant 20 to ensure the reliability of sealing.

The scanning line leads 31 are present also below the sealant 20, in order to decrease the width of the frame. However, in a case of the first scanning line leads 311 formed coplanar with the gate electrode 101, three layers of insulative films, that is, the gate insulator 102, the inorganic passivation film 106, and the upper insulative film 109 are present between the sealant 20 and the leads 31. In the case of the second scanning line leads 312 formed coplanar with the drain electrode 105, two layers of insulative films, that is, the inorganic passivation film 106 and the upper insulative film 109 are present between the sealant 20 and the leads 31. Accordingly, the sealant is in contact with the insulators and sealing failure does not occur.

As has been described above, according to this embodiment, since the scanning line leads 31 are entirely covered with the shield electrode 107 at the inside of the sealant, this can avoid the problem that the common electrode 108 is charged by the gate voltage. Further, since the shield electrode 107 is formed in contiguous with the common electrode 108 formed in the planar shape, the shield electrode 107 and the common electrode 108 formed in the display region 10 can be connected with no discontinuity and, accordingly, the shield effect is excellent.

Further, according to this embodiment, since the shield electrode 107 formed of ITO and the sealant 20 are not in direct contact but the sealant 20 is in contact only with the insulative film, reliability for the sealing portion is not deteriorated.

Figure 5:
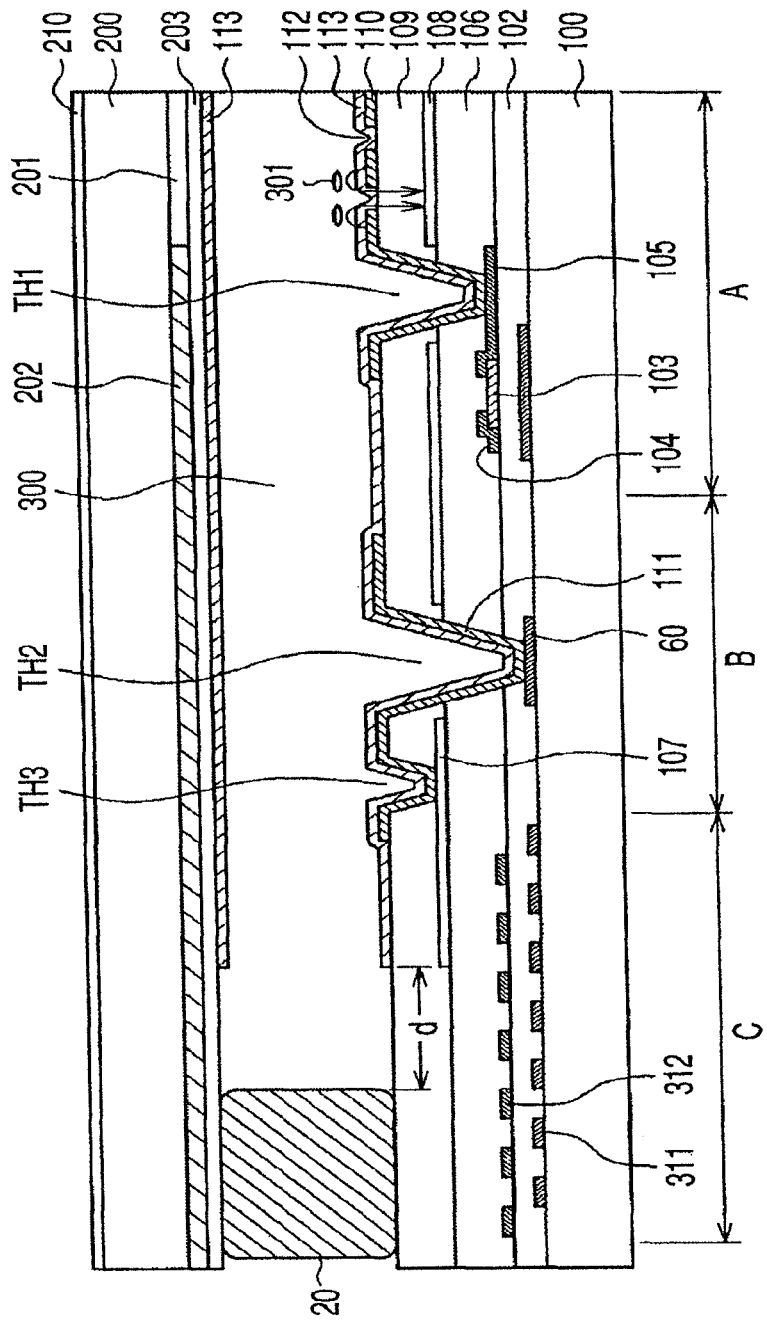
FIG. 5 is a cross sectional view of a liquid crystal display device of a comparative embodiment.

FIG. 5 shows a comparative embodiment to the invention. Like FIG. 2, FIG. 5 is a cross sectional view for the periphery of the liquid crystal display device shown in FIG. 1. The constitution of FIG. 5 is identical with the constitution of FIG. 2 except for the shield electrode 107. In FIG. 5, the shield electrode 107 is not overlapped with the sealant 20, but a region d where the scanning line leads 31 are opposed to the counter substrate 200 by way of the inorganic passivation film 106 and the upper insulative film 109 is present between the inside of the sealant 20 and the end of the shield electrode 107. Accordingly, the inside of the counter substrate 200 is charged under the effect of the gate potential in the region d. Then, the effect of the charge at the inside of the counter substrate 200 exerts on the liquid crystal layer 300 to generate the blanking at the periphery of the screen as shown in FIG. 1.

Figure 6:
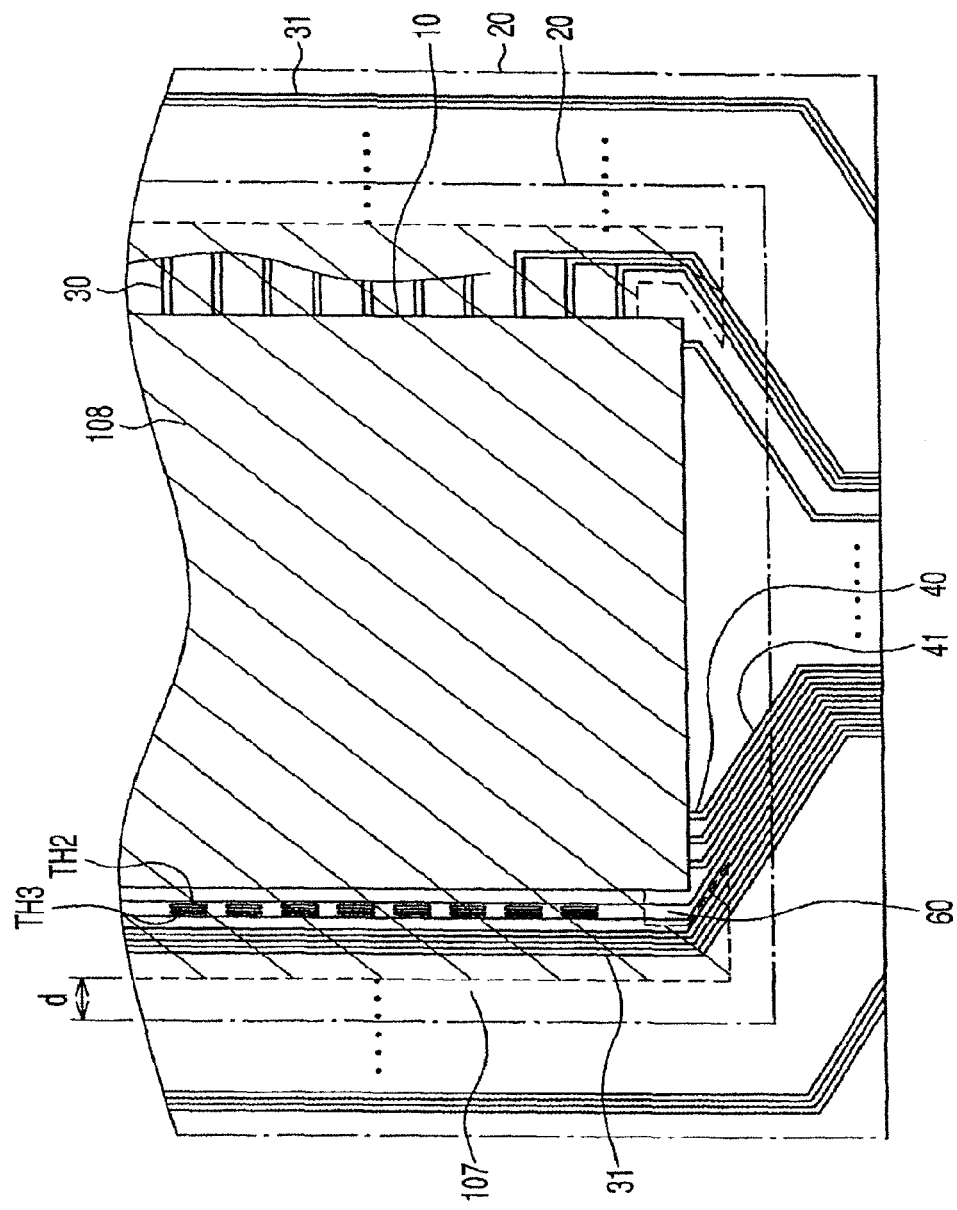
FIG. 6 is a plan view of a TFT substrate of the liquid crystal display device of the comparative embodiment.

FIG. 6 is a plan view for a TFT substrate 100 in the comparative embodiment. The constitution in FIG. 6 is identical with that in FIG. 4 except for the range of a shield electrode 107. In FIG. 6, a sealant 20 is formed at the periphery of a TFT substrate 100. The sealant is shown by a dotted chain. Scanning line leads 31 are disposed on both sides of a display region 10. The shield electrode 107 does not cover the inside of the sealant 20 and the end of the display region 10 entirely but it covers only a portion thereof. That is, a region d where the scanning line leads 31 are not covered is present at the inside of the sealant 20. Then, the inside of the counter substrate 200 is charged by the gate voltage applied to the scanning line leads 31 in the region d and, as has been described with reference to FIG. 5, blanking occurs at the periphery of the display region 10. As described above, even when the shield electrode 107 is disposed above the scanning line leads 31 coplanar with the common electrode 108, no sufficient effect can be obtained against the blanking unless the shield electrode 107 is extended as far as the overlap range between the shield electrode 107 and the sealant 20.

Embodiment 2

In the liquid crystal display device of the IPS system of Embodiment 1, the planar common electrode 108 is formed above the inorganic passivation film 106, the upper insulative film 109 is formed thereabove, and the interdigitated pixel electrode 110 is formed further thereabove. Contrary to the arrangement of the electrodes in the liquid crystal display device of Embodiment 1, a planar pixel electrode 110 may be formed on the inorganic passivation film 106 and an interdigitated common electrode 108 may be formed thereabove while sandwiching the upper insulative film 109 between them. The shape of the common electrode 108 in this case may be identical with that for the interdigitated electrode shown in FIG. 3.

Figure 7:
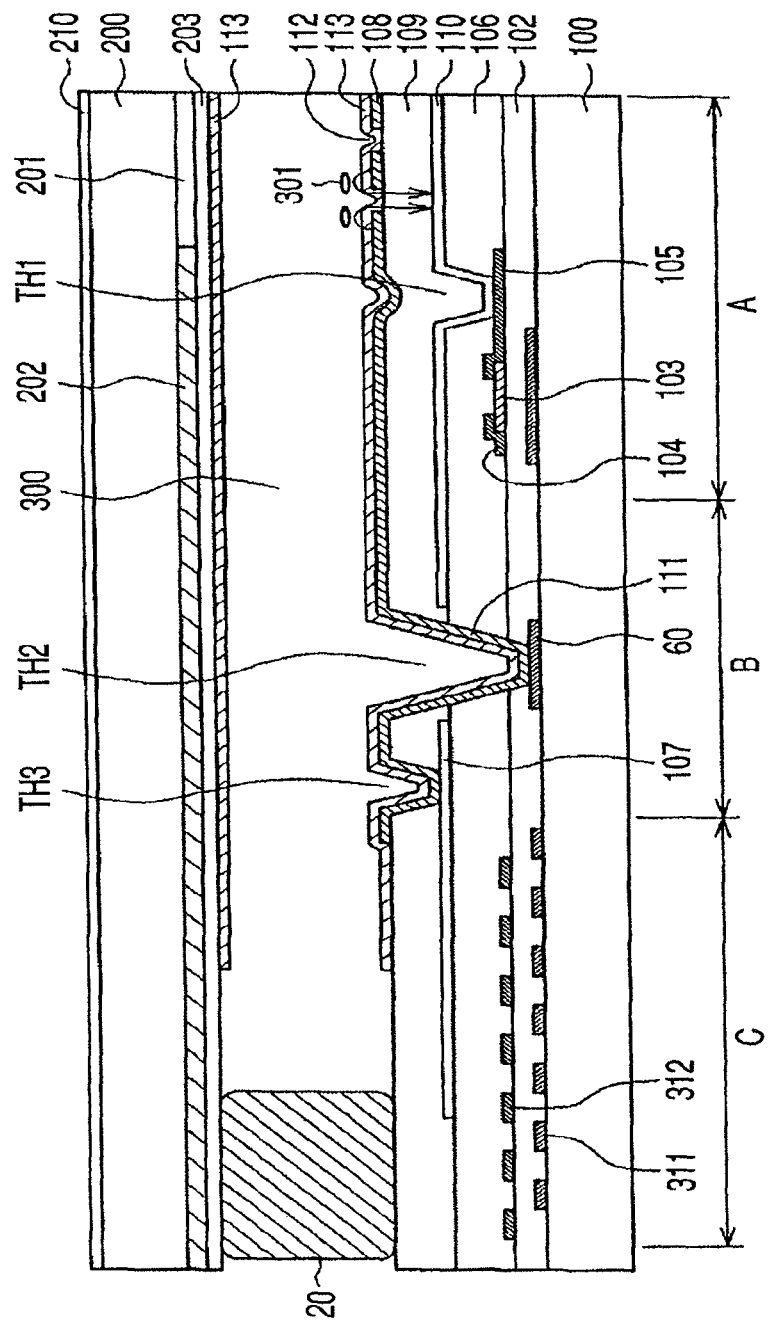
FIG. 7 is a cross sectional view of a liquid crystal display device as a second embodiment of the invention.

In FIG. 7, a planar pixel electrode 110 is formed above the inorganic passivation film 106 in the pixel area. An upper insulative film 109 is formed above the planar pixel electrode 110, and an interdigitated common electrode 108 is formed above the upper insulative film 109. The shield electrode 107 covering the scanning line leads 31 is formed of an ITO film simultaneously with the formation of the pixel electrode 110. The shield electrode 107 is formed by an ITO film simultaneously with the pixel electrode 110. The shield electrode 107 is formed simultaneously with the formation of the pixel electrode 110 and a common potential is supplied from the common wiring 60 through the second by way of hole TH2 and the third through hole TH3 to the shield electrode 107. Accordingly, in the Embodiment 2, the ITO film constituting the pixel electrode 110 and the ITO film constituting the shield electrode 107 are not formed as a continuous film.

The constitution as shown in FIG. 7 can be formed by the following process. The process is identical with that of the Embodiment 1 shown in FIG. 2 as far as the formation of the inorganic passivation film 106. After forming the inorganic passivation film 106, a first through hole TH1 is formed for connecting the pixel electrode 110 with the drain electrode 105 of the TFT. Then, ITO is sputtered. By patterning the deposited ITO film, the pixel electrode 110, the contact of the through hole portion, and the shield electrode 107 are formed. In this case, the pixel electrode 110 and the shield electrode 107 are not formed as a continuous film.

Then, the upper insulative film 109 is formed of SiN. Then, in the same manner as in the Embodiment 1, a second through hole TH2 and a third through hole TH3 are formed. Then, ITO as the common electrode 108 is deposited by sputtering. By patterning ITO, the interdigitated common electrode 108 and the contact of the through holes are formed. Among the through holes, only the first through hole TH1 for connecting the drain electrode 105 with the pixel electrode 110 is different from the Embodiment 1 in FIG. 2.

The Embodiment 2 is identical with the Embodiment 1 in that the shield electrode 107 is formed as far as the portion below the sealant 20 in a planar view. Further, it is also identical with the Embodiment 1 in that the common voltage is applied to the shield electrode 107. Accordingly, the same effect as in the Embodiment 1 can be obtained also in the liquid crystal display device of the IPS system of a type in which the planar pixel electrode 110 is disposed to the lower side and the common electrode 108 is formed thereabove in the interdigitated shape by way of the insulative film.

For the Al alloy forming the gate electrode, the common wiring coplanar therewith, and the second scanning line leads described previously, the Al alloy may be replaced with an AlNd alloy or the Mo alloy may be replaced with an MoCr alloy. In the same manner, for the source electrode or the drain electrode, the Mo alloy may be sandwiched with MoCr alloys, or the AlNd alloy may be sandwiched with MoCr alloys. It is evident that the alloys described above are not limitative but a structure in which other pure metals or alloys are laminated may also be adopted.

Further, in FIG. 4, FIG. 6, etc., a common voltage is supplied from the common wiring to the shield electrode 107 or the common electrode 108 in the common wiring connection portion at the outside of the display region. However, it is not particularly restricted thereto, but the common wiring 60 may be disposed in parallel with the scanning lines 30 in the display region and a common wiring connection portion of supplying a common voltage to the shield electrode 107 or the common electrode 108 may be disposed in the display region. This can stabilize the potential of the common electrode 108 in the display region. Further, it may also be adopted such that the common wiring connection portion outside of the display region shown in the drawing is not disposed, but the common voltage may be supplied from the common wiring 60 to the shield electrode 107 and the common electrode 108 only by the common wiring connection portion in the display region described previously. This can decrease the area at the outside of the display region.

Further, while the second through hole TH2 and the third through hole TH3 are disposed in combination in the first direction in the common wiring connection portion, they may also be disposed in combination in the second direction. This can decrease the area at the outside of the display region.

As shown in FIG. 4 in this embodiment, crossing between the scanning lines 30 and the common wiring 60 is prevented by driving the scanning lines 30 on the side closer to the terminal portion of the display region by way of the scanning line leads 31 disposed on the right of the TFT substrate, and driving the scanning lines 30 on the side remote from the terminal portion of the display region by way of the scanning line leads 31 disposed on the left of the TFT substrate and providing a common wiring between the display region and the scanning line leads 31 on the left of the TFT substrate. However, the common wirings 60 may be disposed on both right and left sides of the display region and the common wiring connection portion may be disposed to each of them.

In this embodiment, as shown in FIG. 4, FIG. 6, etc., the common wiring 60 is disposed between the scanning line leads 31 and the video line leads 41 at the terminal portion. While the shield electrode 107 covers the scanning line leads 41, it does not cover the common wiring 60.

The invention claimed is:
1. A display device comprising:
a first substrate;
a second substrate opposite the first substrate, the second substrate including a first electrode having a planar shape, a second electrode over the first electrode, an insulative film between the first electrode and the second electrode, and a display region in which pixels formed with a TFT are arranged in a matrix;

first lines extending in a first direction and arranged in a second direction;

second lines extending in the second direction and arranged in the first direction in the display region;

first line leads configured to connect the first lines with a first line driving circuit outside the display region; and a third electrode coplanar with the first electrode, the third electrode having a portion extending below a sealant at a periphery of the first substrate and the second substrate and over the first line leads, wherein the insulative film is between the third electrode and the sealant, and the third electrode is arranged such that if a potential is applied to the first electrode, an identical potential is applied to the third electrode.

* * * * *